(12) United States Patent
Ushie

(10) Patent No.: US 7,956,789 B2
(45) Date of Patent: Jun. 7, 2011

(54) DISCONNECTION DETECTING CIRCUIT AND DISCONNECTION DETECTING METHOD BY USING CAPACITOR

(75) Inventor: Kenichi Ushie, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 12/662,068

(22) Filed: Mar. 30, 2010

(65) Prior Publication Data
US 2010/0245141 A1 Sep. 30, 2010

(30) Foreign Application Priority Data
Mar. 31, 2009 (JP) ................................. 2009-086354

(51) Int. Cl.
*H03M 1/12* (2006.01)
(52) U.S. Cl. ......... 341/155; 341/120; 341/122; 341/141
(58) Field of Classification Search .................. 341/122, 341/141, 155
See application file for complete search history.

(56) References Cited

U.S. PATENT DOCUMENTS

| | | | |
|---|---|---|---|
| 6,737,850 B2 * | 5/2004 | Kushiyama | 324/72 |
| 7,009,537 B2 | 3/2006 | Kabune | |
| 7,049,993 B2 * | 5/2006 | Ando | 341/155 |
| 7,427,936 B2 * | 9/2008 | Takeuchi | 341/120 |
| 7,688,239 B2 * | 3/2010 | Onoda | 341/120 |
| 7,830,286 B2 * | 11/2010 | Kabune et al. | 341/122 |

FOREIGN PATENT DOCUMENTS

JP 3861874 B2 10/2006

* cited by examiner

*Primary Examiner* — Khai M Nguyen
(74) *Attorney, Agent, or Firm* — McGinn IP Law Group, PLLC

(57) ABSTRACT

A disconnection detecting method includes charging a capacitor by connecting a node of the capacitor to a first power source line supplied with a first power source potential, connecting the node of the capacitor to an input terminal, after the node of the capacitor is disconnected from the first power source line, and converting a first value on the node to a first digital data. The method further includes discharging the capacitor by connecting the node of the capacitor to a first power source line supplied with a second power source potential, after the node is disconnected from the input terminal, connecting the node of the capacitor to the input terminal, after the node of the capacitor is disconnected from the second power source line, and converting a second value on the node to a second digital data. The method further includes comparing the first digital data with the second digital data to determine whether a difference between the first and second digital data exists, and determining that the input terminal is abnormal when the difference exists.

7 Claims, 6 Drawing Sheets

DISCONNECTION DETECTING CIRCUIT AND DISCONNECTION DETECTING METHOD BY USING CAPACITOR

INCORPORATION BY REFERENCE

This application is based upon and claims the benefit of priority from Japanese Patent Application No. 2009-086354 which was filed on Mar. 31, 2009, the disclosure of which is incorporated herein in its entirety by reference.

BACKGROUND OF THE INVENTION

1. Field of the Invention

The present invention relates to a technique for detecting a disconnection of a semiconductor device.

2. Description of Related Art

A safety function for automatically avoiding a life-threatening condition is mounted in an automobile, a gas meter, and so on. Such a function is realized by a semiconductor device (hereinafter referred to as "microcomputer") which is connected with diverse sensors. When an input signal line of such a microcomputer is disconnected, no significant signal is input from the sensors, and the microcomputer cannot detect the occurrence of an abnormal state. Then, there occurs a severe problem that the safety function is not executed when needed. With an aim to prevent the erroneous determination of the microcomputer described above, a demand is made on a technique for surely detecting the disconnection.

In a normal disconnection detecting method, for example, in the case of a microcomputer having an A/D conversion function, after the interior of the microcomputer has been initialized to 0 V, the microcomputer is connected to the input signal line. When a voltage value developed by A/D conversion of an input signal falls within a set value to be determined as a disconnection, it is determined that there occurs the disconnection. However, in the detecting method of this type, in the case where a wiring capacity outside of the microcomputer is very large as compared with a capacity of a sample and hold capacitor inside of the microcomputer, after the interior of the microcomputer has been initialized to 0 V, the microcomputer is connected to the input signal line. In this case, because the wiring capacity outside of the microcomputer charges the capacity of the sample and hold capacitor, the voltage value developed by the A/D conversion potentially reaches a voltage value that is not determined as a disconnection although the disconnection occurs.

FIG. 6 shows the configuration of a semiconductor device according to a related art described in Patent Document 1 (Japanese Patent No. 3861874). In the figure, references VIN1 and VIN2 indicate inputs of sensors which are substituted with voltage sources. Those VIN1 and VIN2 are connected to terminals AIN1 and AIN2, respectively. An A/D converter 101 includes an input Ch selection switch section 102, a comparator 103, an A/D conversion control section 104, a comparative voltage selection section 105, a conversion register section 106, an S/N (sample and hold) capacitor initialization SW (switch) 107, a parity operation section 108, and a register storage section 109 having Ch registers 00 to 11. The A/D converter 101 is connected to a control section 110 through signal lines of an address bus, a data bus, an RD (read request), and a WR (write request), which operate on the basis of clock signals φ. The control section 110 is formed as a normal computer, and made up of a CPU (central processing unit), a ROM (road only memory), an RAM (random access memory), an input/output circuit, bus lines connecting those configurations, etc., which are well known and not shown).

The CPU executes control according to a program and data which are stored in the ROM and the RAM. Data read from the A/D converter 101 and the abnormality determination of the A/D converter 101 are executed by the program included in the control section 110.

Subsequently, a description will be given of the operation of the semiconductor device configured as described above. The A/D converter 101 operates on the basis of a CLK signal supplied from the control section 110. In an example of FIG. 6, a voltage across an S/H capacitor C1 becomes a lower reference voltage VREF− (0 V). When the initialization of the S/H capacitor C1 has been completed, the S/H capacitor initialization SW 107 and an SW3 are opened to select an AIN2 (Ch10). When the AIN2 (Ch10) has been selected, an SW10, an SW1, and the SW3 are closed, and electric charge corresponding to a value of the VIN2 is stored in the S/H capacitor C1. When the electric charge has been stored, the SW1 and the SW3 are opened, and the SW2 is closed to execute A/D conversion. A comparative voltage generated on the basis of an upper reference voltage VREF+ and the lower reference voltage VREF− are compared with a voltage of the electric charge stored in the S/H capacitor C1 by the comparative voltage selection section 105, and the comparison result is sequentially held in the conversion register section 106. Then, at a point of time when the VIN2 coincides with the comparative voltage, a value held in the conversion register section 106 is stored as an A/D conversion value in a Ch register 10 in the register storage section 109 (a conversion result storage section in a known technique). Thereafter, the SW1 and the SW2 are opened. Those processing is controlled by the A/D conversion control section 104.

Thereafter, the S/H capacitor initialization SW 107 and the SW3 are again closed to initialize the S/H capacitor C1. When the initialization of the S/H capacitor C1 has been completed, an S/H capacitor initialization SW25 and the SW3 are opened, and a subsequent Ch is selected to implement the A/D conversion of the subsequent Ch.

Subsequently, a description will be given of a method of detecting abnormality in the semiconductor device. When A/D conversion has been executed, the electric charge that has been stored in the S/H capacitor C1 becomes electric charge when the electric charge when the S/H capacitor has been initialized, that is, a result obtained by subjecting VREF− (0 V) to A/D conversion. As usual, when an important sensor input is subjected to A/D conversion, an effective value of the input voltage (VIN1, VIN2) from the sensors is a value ranging from 10 to 90% of a reference voltage, and other values are set as abnormal values at the time of disconnection (including short-circuiting). When the reference voltage is set to 5 V (the upper reference voltage VREF+ is 5 V, the lower reference voltage is 0 V), the effective value of the input voltage from the sensors is 0.5 to 4.5 V, and other values (that is, a value smaller than 0.5 V, or a value larger than 4.5 V) are allowed to determine that the sensor is abnormal. When the input from each selected Ch is a normal value (for example, 3 V), electric charge corresponding to 3 V is stored in the S/H capacitor C1 to execute A/D conversion, and an A/D conversion result of 3 V is obtained. However, when the S/H capacitor C1 is abnormal, or when disconnection abnormality exists in an input system from the sensors, because no electric charge is stored in the S/H capacitor C1, the electric charge stored in the S/H capacitor C1 remains in a state where the S/H capacitor C1 has been initialized (zero). At that time, when A/D conversion is executed, the conversion result of 0 V is obtained, and the control section 110 can determine that the A/D converter 101 is abnormal.

Further, one (for example, the input terminal VIN1) of the inputs from the A/D converter 101 may be an arbitrary voltage (for example, 2.5 V) generated by a stabilized power supply different from a stabilized power supply that is connected to an A/D supply voltage (for example, 5 V) applied to the A/D converter 101, or the reference voltage (VREF+, VREF−). In this case, the control section 110 compares a real conversion result of that voltage with an estimated value of the conversion result that has been stored in the storage section of the control section 110 in advance. When a difference therebetween is equal to or higher than a given value, it is determined that the difference is abnormal. As a result, like the above case, the abnormality of the A/D supply voltage, the comparative voltage selection section 105, and the input terminal VIN1 can be detected.

SUMMARY

However, the above related art suffers from a risk that erroneous determination occurs in the detection of a disconnection. This is because a case in which the wiring capacity outside of the microcomputer in the input signal section is larger than the S/H capacitor capacity inside of the microcomputer is assumed. In this case, even if the interior of the microcomputer has been initialized to 0 V, when the microcomputer is connected to the disconnected input signal line, the wiring capacity outside of the microcomputer charges the S/H capacitor capacity inside of the microcomputer, and returns to a voltage value that cannot be determined as abnormality. Also, in the microcomputer, the input voltage does not decrease down to about 0 V due to the leakage current to the exterior of the microcomputer, or the like, with the result that the voltage value may get saturated. Similarly, in this case, the voltage value is not changed, and the erroneous determination potentially occurs.

A disconnection detecting circuit of an exemplary aspect includes: a sample and hold capacitor that stores electric charge which is input from an input terminal; a full charge section that fully charges the sample and hold capacitor; a discharge section that discharges the sample and hold capacitor; an A/D conversion section that converts an analog signal indicative of a potential of the sample and hold capacitor into a digital signal; a storage circuit section that stores a conversion result from the A/D conversion section; an A/D conversion control section that controls the full charge of the sample and hold capacitor by the full charge section with an input from the input terminal, controls the discharge of the sample and hold capacitor by the discharge section, and stores A/D conversion results of the potential of the sample and hold capacitor before and after discharge in the storage circuit section; a comparison section that compares the A/D conversion results before and after discharge, which are stored in the storage circuit section; a difference determination section that detects a difference between the potentials before and after discharge on the basis of a comparison result by the comparison section; and a control section that determines that the input terminal is abnormal when the difference determination section determines that there is the difference.

According to the exemplary aspect, the sample and hold capacitor is first fully charged with the input signal from the input terminal being a disconnection diagnosis target, and the A/D conversion results of the potential of the sample and hold capacitor at that time are stored in the storage circuit section. Thereafter, the sample and hold capacitor is discharged, and the A/D conversion results after discharge are stored in the storage circuit section. Then, the A/D conversion results before and after discharge which have been stored in the storage circuit section are compared with each other. When there is no difference therebetween, it is determined that there is no disconnection. When there is a difference therebetween, it is determined that there is a disconnection. When there is no disconnection, because electric charge is supplied from a signal generation source such as a sensor which is connected to the input terminal, the potential of the sample and hold capacitor is held constant. For that reason, there occurs no difference in the A/D conversion results before and after discharge. On the other hand, when there is a disconnection, because the supply of electric charge from the signal generation source is not conducted or is unstable, a difference as large as the discharged amount occurs in the A/D conversion results before and after discharge.

According to an other exemplary aspect, a disconnection detecting method includes fully charging a sample and hold capacitor; subjecting a potential of the sample and hold capacitor to A/D conversion by switching to an input from an input terminal after the sample and hold capacitor is charged; storing a first A/D conversion result obtained by the subjecting the potential of the sample and hold capacitor; discharging the sample and hold capacitor; subjecting the potential of the discharged sample and hold capacitor to A/D conversion; storing a second A/D conversion result obtained by subjecting the potential of the discharged sample and hold capacitor; comparing the first A/D conversion result with the second A/D conversion result to determine whether a difference exists between the potentials before and after discharge, or not; repeating the above steps by a given number of times; and determining that the input terminal is abnormal when it is determined that there is the difference therebetween.

The other aspect is described from the viewpoint of a method with respect to the same technical concept as that of the above-mentioned circuit, and the operational effects are identical with those in the circuits.

According to the exemplary aspects, disconnection diagnosis can be precisely executed without being affected by the external wiring capacity.

BRIEF DESCRIPTION OF THE DRAWINGS

The above and other exemplary aspects, advantages and features of the present invention will be more apparent from the following description of certain exemplary embodiments taken in conjunction with the accompanying drawings, in which.

DETAILED DESCRIPTION OF THE EXEMPLARY EMBODIMENTS

Exemplary Embodiment 1

Figure 1:
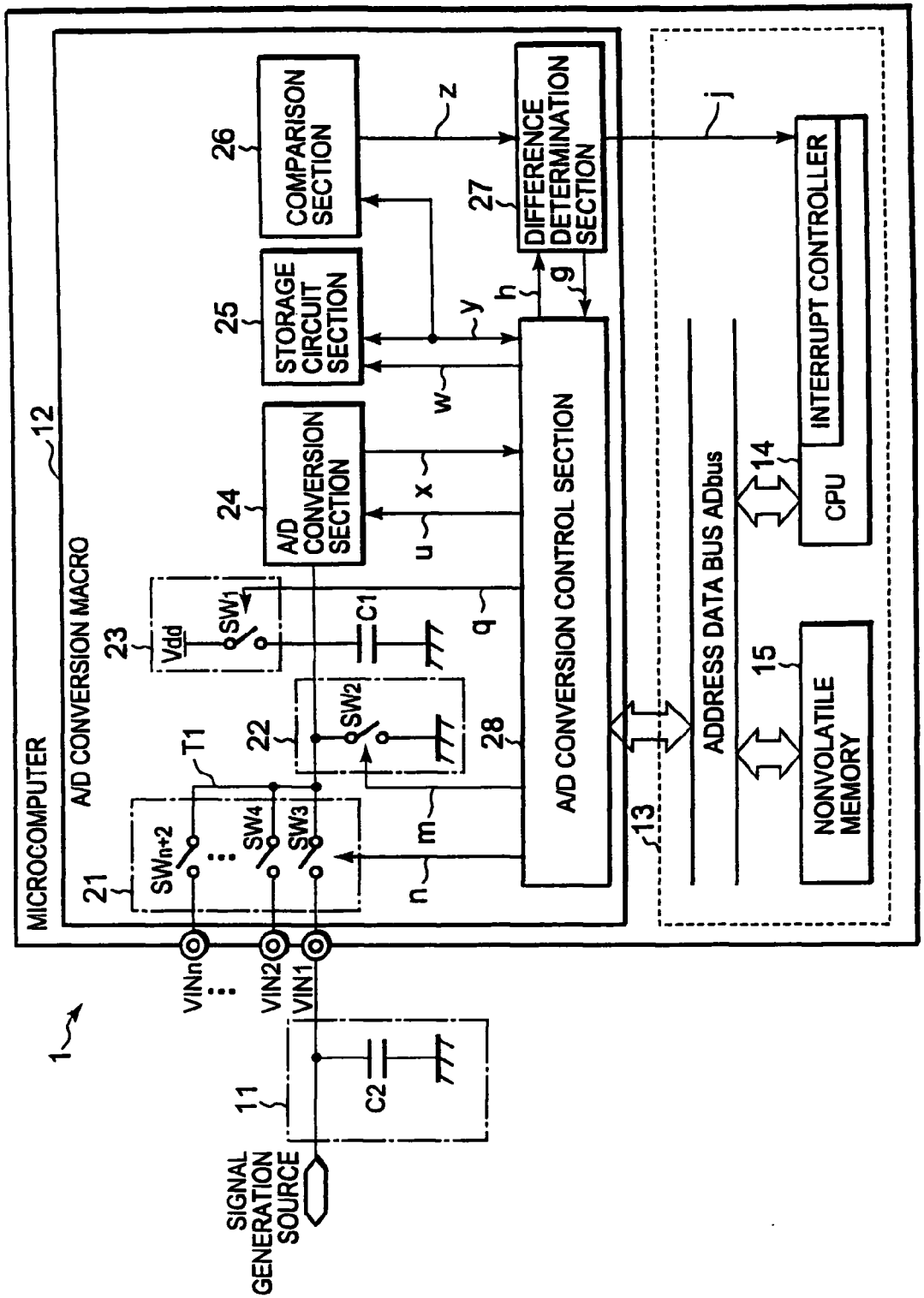
FIG. 1 is a functional block diagram showing the configuration of a disconnection detecting circuit according to an exemplary embodiment 1 of the present invention.

FIG. 1 shows the configuration of a disconnection detecting circuit 1 according to a first exemplary embodiment. A signal to be outputted from a signal generation source is supplied to an external wiring capacitor 11. An output of the external wiring capacity 11 is input to input terminals VIN1 to VINn of an A/D conversion macro 12. The external wiring capacity 11 is connected to any one of the input terminals VIN1 to VINn, and the ground through a capacitor C2.

A control section 13 includes a CPU 14, a nonvolatile memory 15, and an address/data bus ADbus. The address/data bus ADbus is connected to the CPU 14, the nonvolatile memory 15, and the A/D conversion macro 12.

The A/D conversion macro 12 includes input terminals VIN1 to VINn, an input signal selection section 21, a discharge section 22, a full charge section 23, a sample and hold (S/H) capacitor C1, an A/D converter 24, a storage circuit section 25, a comparator 26, a difference determination section 27, and an A/D conversion control section 28.

The input signal selection section 21 outputs, as an output signal T1, a signal which has been input from the external wiring capacity 11 via the input terminals VIN1 to VINn to the discharge section 22, to the discharge section 22 via input signal selection switches SW3 to SWn+2.

The input signal selection switches SW3 to SWn+2 are identical in number with the input terminals since the switches need to select a target input terminal when executing A/D conversion. In order to control those switches SW3 to SWn+2, a control signal n is outputted from the A/D conversion control section 28.

The discharge section 22 connects a signal line T1 outputted from the input signal selection section 21 to the ground via a discharge control switch SW2. The open/close control of the discharge control switch SW2 is conducted according to a control signal m to be outputted from the A/D conversion control section 28.

The full charge section 23 connects a signal line T1 outputted from the input signal selection section 21 to a power supply Vdd via a full charge control switch SW1. The open/close control of the full charge control switch SW1 is conducted according to a control signal q to be outputted from the A/D conversion control section 28.

The S/H capacitor C1 connects a signal line T1 outputted from the input signal selection section 21 to the ground.

The A/D converter 24 receives a signal T1 outputted from the input signal selection section 21, and a control signal u outputted from the A/D conversion control section 28. The A/D conversion result x by the A/D converter 24 is outputted to the A/D conversion control section 28.

Figure 2:
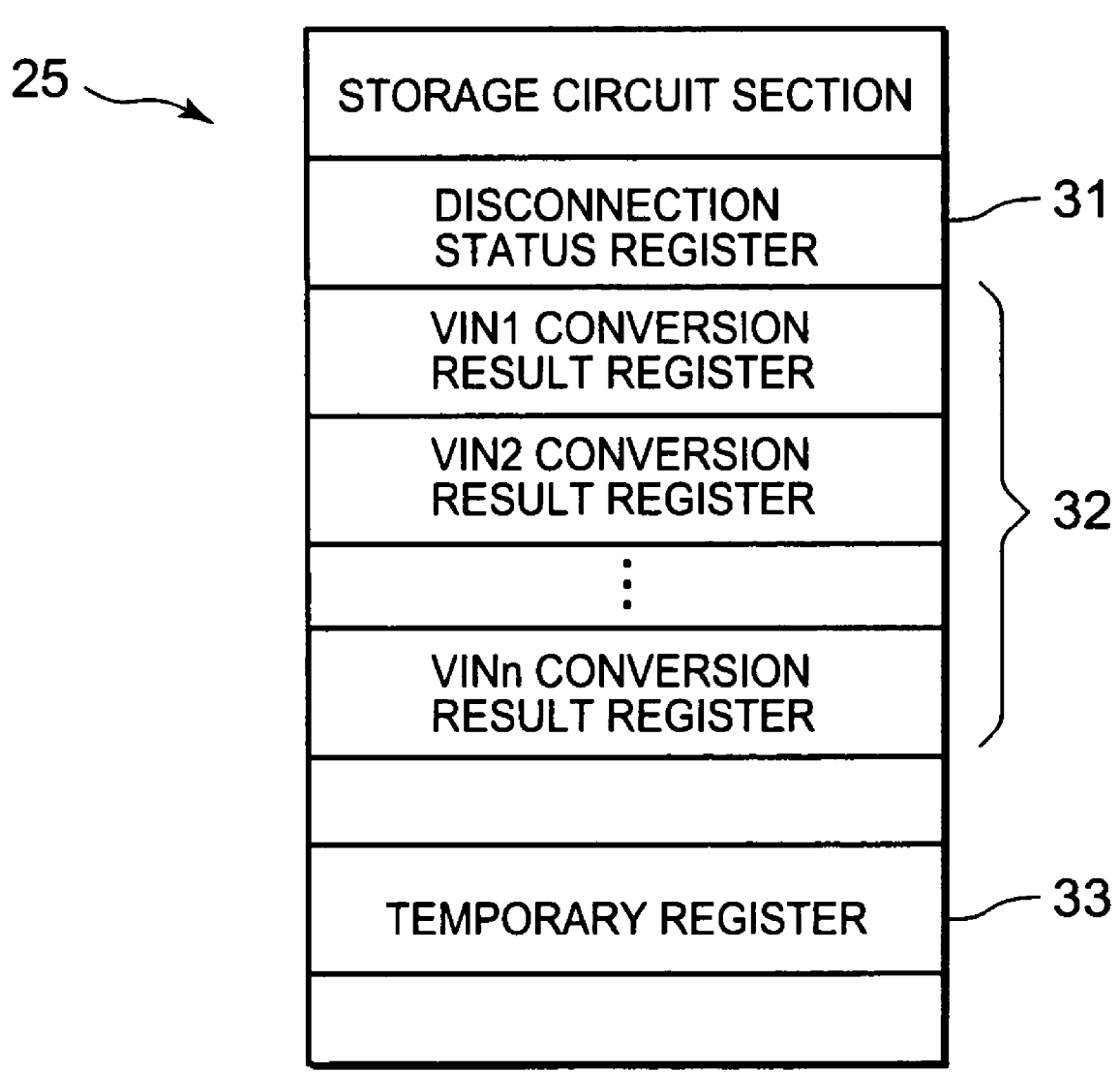
FIG. 2 is a functional block diagram showing the configuration of a storage circuit section according to the exemplary embodiment 1.

As shown in FIG. 2, the storage circuit section 25 includes a disconnection status register 31 that holds a disconnection status, VIN1 to VINn conversion result registers 32 that hold the A/D conversion results of the respective input terminals VIN1 to VINn, and a temporary register 33 that temporarily holds the A/D conversion result. The storage circuit section 25 receives a control signal w from the A/D conversion control section 28, and outputs held data y to the A/D conversion control section 28 and the comparator 26 via a data signal line y.

The comparator 26 receives a signal held by the temporary register 33 and signals held by the VIN1 to VINn conversion result registers 34 via the A/D conversion control section 28, and outputs a comparison result z of those two signals to the difference determination section 27.

The difference determination section 27 receives a control signal h from the A/D conversion control section 28 and a comparison result z from the comparison section 26, and outputs a determination end signal g to the A/D conversion control section 28, and a disconnection presence notification signal j to the CPU 14.

Figure 3:
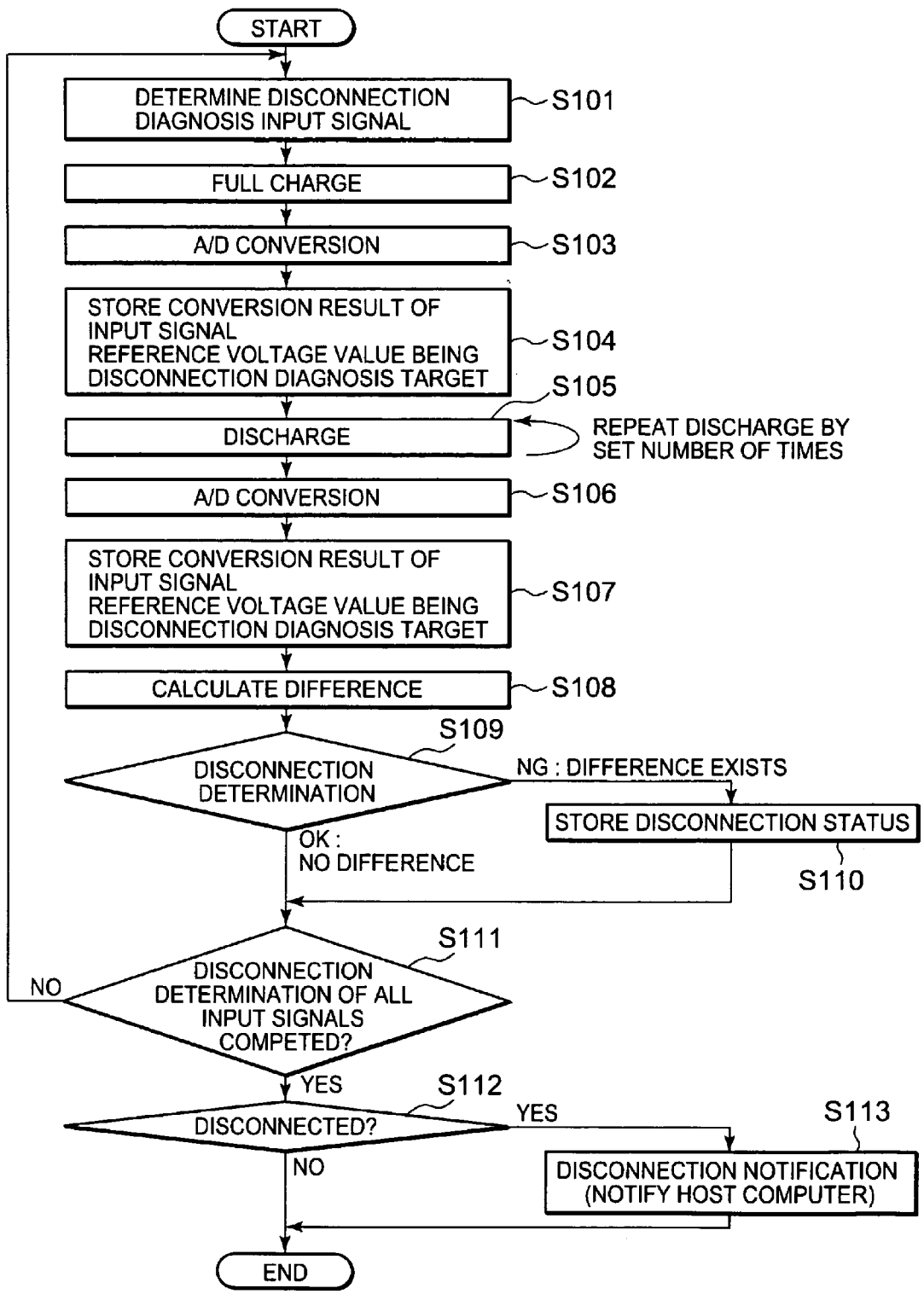
FIG. 3 is a flowchart showing the operation of the disconnection detecting circuit according to the exemplary embodiment 1.

FIG. 3 shows the operation of the disconnection detecting circuit 1. The microcomputer starts a disconnection determination sequence of the input terminal after power on. The A/D conversion control section 28 closes the input signal selection switch SW3 of the input signal selection section 21, and starts the disconnection determination from the input terminal VIN1 (Step S101).

The A/D conversion control section 28 opens the switches other than the full charge control switch SW1 of the full charge section 23, and closes the switch SW1 to fully charge the S/H capacitor C1 (Step S102).

The A/D conversion control section 28 opens the full charge control switch SW1 after having fully charged the S/H capacitor C1, closes the input signal selection switch SW3 of the input signal selection section 21, and selects the input terminal VIN1 to perform the A/D conversion of the input terminal VIN1 (Step S103).

The A/D conversion control section 28 stores a voltage value (a reference voltage value of the input signal being a disconnection diagnosis target) which is the conversion result by the A/D converter 24 into the temporary register 33 within the storage circuit section 25 (Step S104).

The A/D conversion control section 28 opens the input signal selection switch SW3 of the input signal selection section 21, and closes the discharge control switch SW2 to perform discharge. Then, the A/D conversion control section 28 opens the discharge control switch SW2, and closes the input signal selection switch SW3 to charge the S/H capacitor C1 with residual electric charge inflowing from the input terminal VIN1. The A/D conversion control section 28 repeats this operation by a given number of times (Step S105).

The A/D conversion control section 28 opens the discharge control switch SW2, closes the input signal selection switch SW3, and selects the input terminal to perform the A/D conversion of the input terminal VIN1 by the A/D converter 24 (Step S106).

The A/D conversion control section 28 stores a voltage value which is the conversion result by the A/D converter 24 into the VIN1 conversion result register 32 within the storage circuit section 25 (Step S107).

The A/D conversion control section 28 transfers the value stored in the temporary register 35 in Step S104 and the value stored in the VIN1 conversion result register 32 in Step S107 to the comparator 26 to calculate the differential, and outputs the difference calculation result to the difference determination section 27 (Step S108).

The A/D conversion control section 28 executes the determination of disconnection on the basis of the result of processing the difference calculation result in the difference determination section 27 (Step S109). When it is determined that there is a difference in the Step S109 (NG), the A/D conversion control section 28 sets 1 to a bit which is allocated to each input terminal in the disconnection status register 31 within the storage circuit section 25 (Step S110). Then, when it is determined that there is no difference in the Step S109 (OK), or after processing in Step S110 has been completed, the A/D conversion control section 28 determines whether the diagnosis of all the input signals has been completed, or not. When the diagnosis has not yet been completed (NO), processing is shifted to Step S101 (Step S111).

The A/D conversion control section 28 ORs (logical OR) all bits of the disconnection status register 31 when it is determined that the diagnosis of all the input signals has been completed (YES) in Step S111. Then, when the logical OR is 1, and it is determined that there is a disconnection (YES) in the Step S112, the A/D conversion control section 28 notifies a host system of the occurrence of disconnection by the difference determination section 27, and thereafter completes the disconnection diagnosis process (Step S113). On the other hand, when the logical OR is 0, and it is determined that there is no disconnection (NO) in the Step S112, the A/D conversion control section 28 completes the disconnection diagnosis process.

As described above, in the disconnection detecting circuit 1, any one of the input terminals VIN1 to VINn being the disconnection diagnosis targets is selected by the input signal selection section 21, and the S/H capacitor C1 is fully charged by the full charge section 23. The A/D conversion result of the potential of the S/H capacitor C1 at that time is stored in the temporary register 33 of the storage circuit section 25 once, and set as a reference voltage value. Thereafter, the S/H capacitor C1 is discharged by the discharge section 22, and the A/D conversion results after discharge are stored in the corresponding VIN1 to VINn conversion result registers 32. Then, the A/D conversion results before and after discharge, which have been stored in the temporary register 33 and the VIN1 to VINn conversion result registers 32 are compared with each other. When there is no difference, it is determined that there is no disconnection, whereas when there is a difference, it is determined that there is a disconnection. When there is no disconnection, because the potential is held constant by supply of electric charge from the signal generation source, no difference occurs between the A/D conversion results before and after discharge. On the other hand, when there is a disconnection, because the supply of electric charge from the signal generation source is not conducted or is unstable, a difference as large as the discharged amount occurs in the A/D conversion results before and after discharge. As a result, disconnection diagnosis can be precisely executed without being affected by the external wiring capacity 11.

Exemplary Embodiment 2

Figure 4:
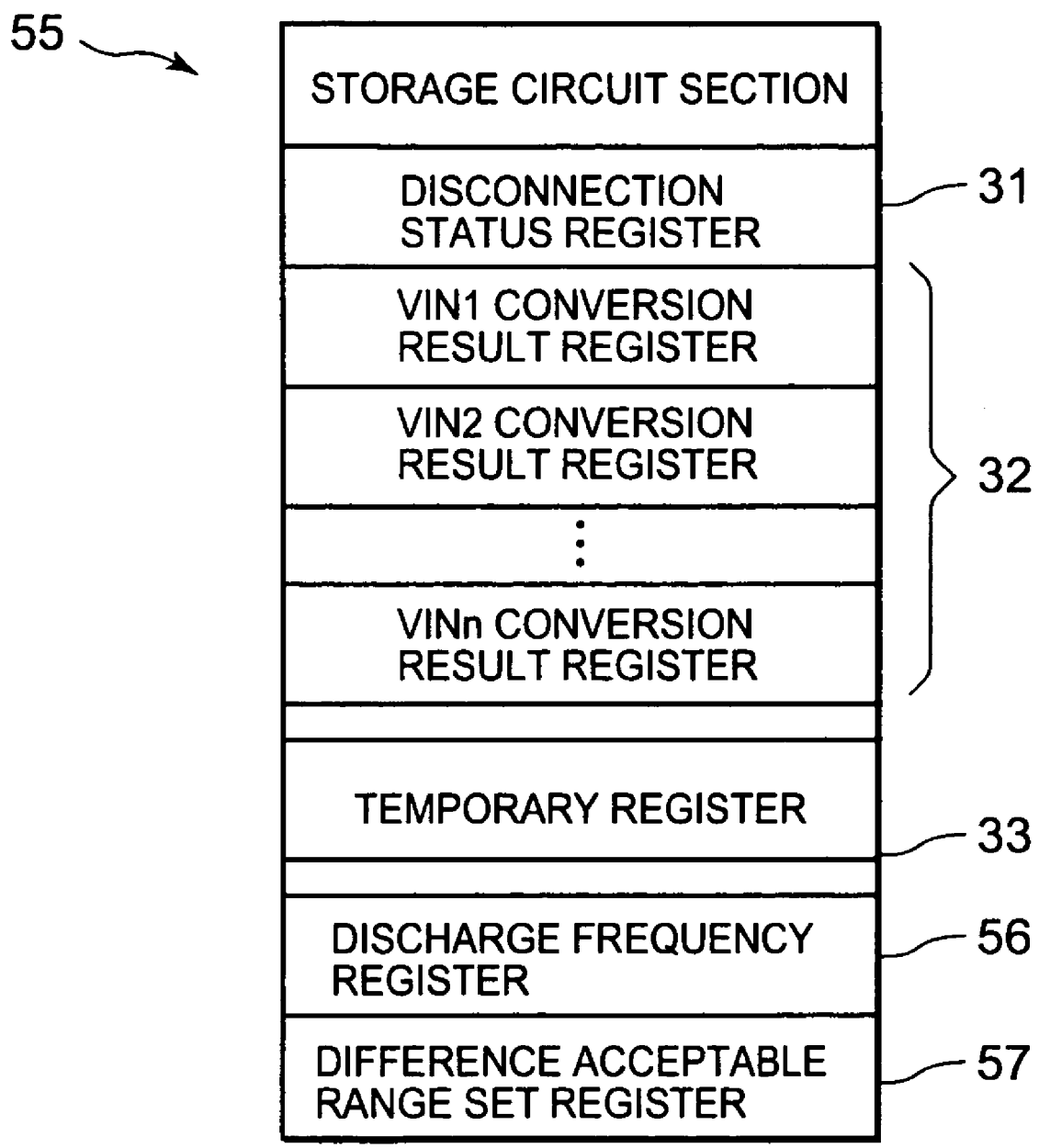
FIG. 4 is a functional block diagram showing the configuration of a storage circuit section according to an exemplary embodiment 2 of the present invention.

FIG. 4 shows the configuration of a storage circuit section 55 in a disconnection detecting circuit according to a second exemplary embodiment. The storage circuit section 55 is used instead of the storage circuit section 25 in the disconnection detecting circuit 1 according to the exemplary embodiment 1 shown in FIG. 1.

The storage circuit section 55 further includes a discharge frequency register 56 that sets the number of discharges, and a difference acceptable range setting register 57 that sets a difference acceptable range, in addition to the configuration of the storage circuit section 25 according to the exemplary embodiment 1.

Figure 5:
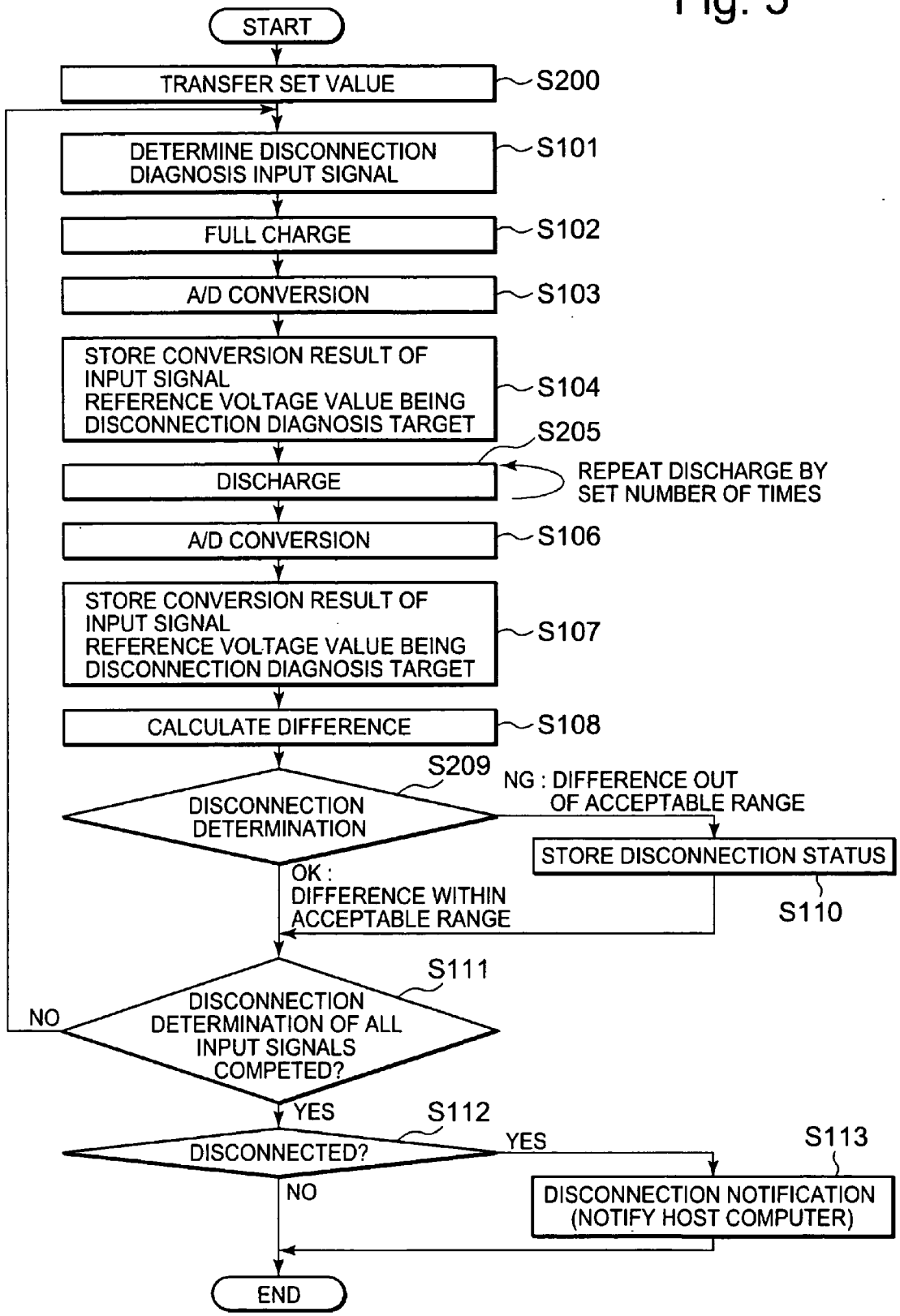
FIG. 5 is a flowchart showing the operation of the disconnection detecting circuit according to the exemplary embodiment 2.
Figure 6:
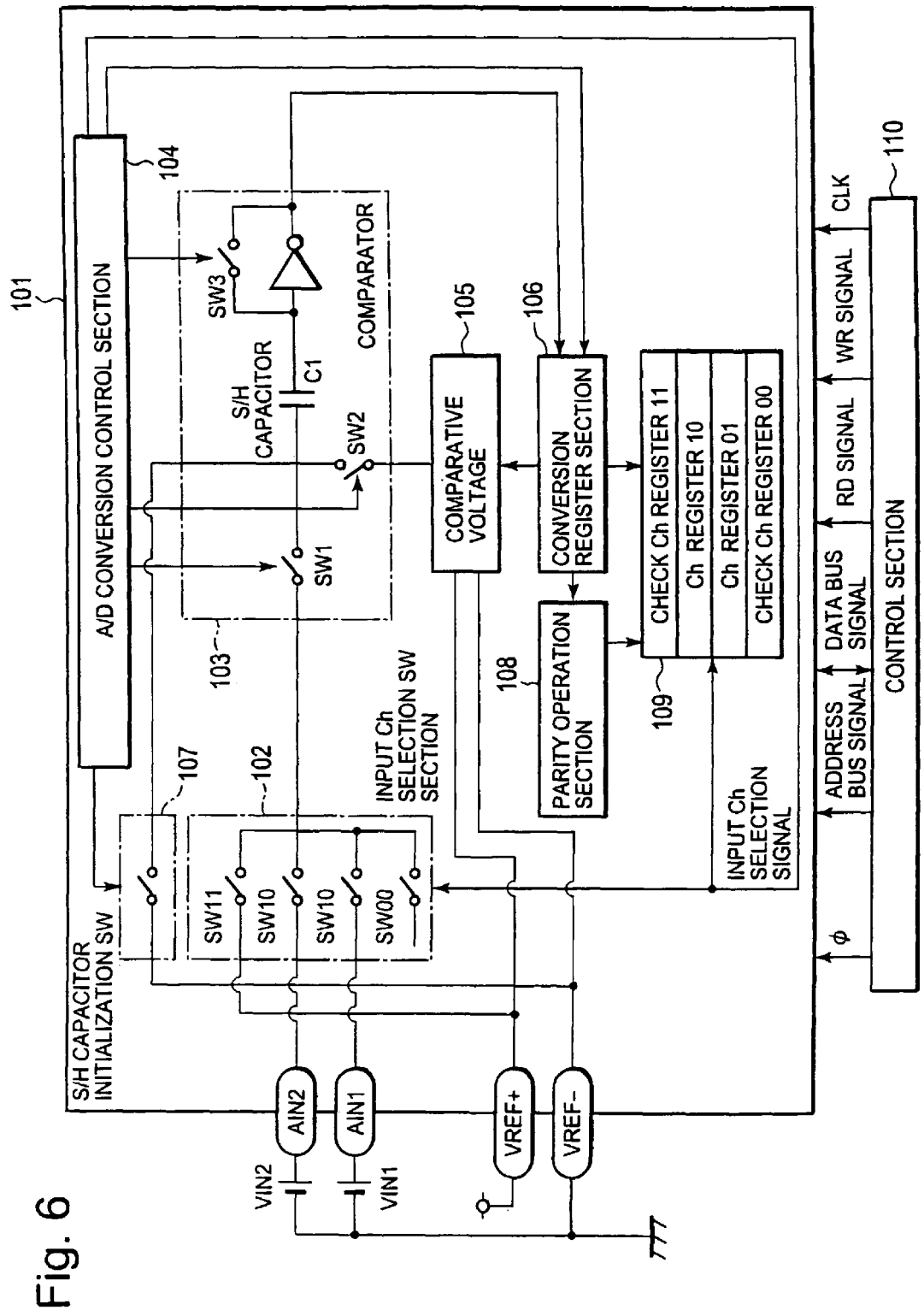
FIG. 6 is a functional block diagram showing the configuration of a semiconductor device according to a related art.

FIG. 5 shows the operation of the disconnection detecting circuit according to the exemplary embodiment 2. The A/D conversion control section 28 (refer to FIG. 1) first performs a set value transfer process of transferring the discharge frequency value and the difference acceptable range set value which are held in the nonvolatile memory 15 in advance to the discharge frequency register 56 and the difference acceptable range setting register 57 in the storage circuit section 55 (Step S200).

Steps S101 to S104 are identical with those in the exemplary embodiment 1, and therefore their description will be omitted.

The A/D conversion control section 28 repeats discharge by the number of times stored in the discharge frequency register 56 (Step S205).

Steps S106 to S108 are identical with those in the exemplary embodiment 1, and therefore their description will be omitted.

The A/D conversion control section 28 determines whether the difference value calculated by the comparator 26 falls within the acceptable range stored in the difference acceptable range set register 57, or not (Step S209).

Step S110 and the subsequent steps are identical with those in the exemplary embodiment 1, and therefore their description will be omitted.

As described above, in the second exemplary embodiment, in the case where there is a difference between the A/D conversion values before and after the discharge step, when the difference value falls within the set acceptable range, it is determined that there is no disconnection, and when the difference value exceeds the acceptable range, it is determined that there is a disconnection. As a result, it is possible to have a margin of the difference value for determining the presence of the disconnection.

The present invention is not limited to the above exemplary embodiments, but can be appropriately changed without departing from the subject matter of the present invention.

Further, it is noted that Applicant's intent is to encompass equivalents of all claim elements, even if amended later during prosecution.

What is claimed is:

1. A disconnection detecting circuit, comprising:
   a sample-and-hold capacitor that stores an electric charge which is input from an input terminal;
   a full charge section that fully charges the sample-and-hold capacitor;
   a discharge section that discharges the sample-and-hold capacitor;
   an analog-to-digital (A/D) conversion section that converts an analog signal indicative of a potential of the sample-and-hold capacitor into a digital signal;
   a storage circuit section that stores a conversion result from the A/D conversion section;
   an A/D conversion control section that controls the full charge of the sample-and-hold capacitor by the full charge section with an input from the input terminal, controls the discharge of the sample-and-hold capacitor by the discharge section, and stores A/D conversion results of the potential of the sample-and-hold capacitor before and after discharge in the storage circuit section;
   a comparison section that compares the A/D conversion results before and after discharge, which are stored in the storage circuit section;
   a difference determination section that detects a difference between the potentials before and after discharge on the basis of a comparison result by the comparison section; and
   a control section that determines that the input terminal is abnormal when the difference determination section determines that there is the difference.

2. The disconnection detecting circuit according to claim 1, wherein the storage circuit section includes a first register that temporarily stores the A/D conversion result after the sampleand-hold capacitor has been fully charged, and second registers that are provided in correspondence with the respective input terminals, and store the A/D conversion result after discharge.

3. The disconnection detecting circuit according to claim 2, wherein the comparison section compares the A/D conversion results before and after discharge with each other on a basis of information stored in the first register and information stored in the second registers.

4. The disconnection detecting circuit according to claim 3, further comprising means for determining that there is no abnormality when the difference falls within a set acceptable range.

5. A disconnection detecting method, comprising:
fully charging a sample-and-hold capacitor;
subjecting a potential of the sample-and-hold capacitor to A/D conversion by switching to an input from an input terminal after the sample-and-hold capacitor is charged;
storing a first A/D conversion result obtained by the subjecting the potential of the sample-and-hold capacitor;
discharging the sample-and-hold capacitor;
subjecting the potential of the discharged sample-and-hold capacitor to A/D conversion;
storing a second A/D conversion result obtained by subjecting the potential of the discharged sample-and-hold capacitor;
comparing the first A/D conversion result with the second A/D conversion result to determine whether a difference exists between the potentials before and after discharge, or not;
repeating the above steps by a given number of times; and
determining that the input terminal is abnormal when it is determined that there is the difference therebetween.

6. The disconnection detecting method according to claim 5, further comprising determining that there is no abnormality when the difference falls within a set acceptable range.

7. A disconnection detecting method, comprising:
charging a capacitor by connecting a node of the capacitor to a first power source line supplied with a first power source potential;
connecting the node of the capacitor to an input terminal, after the node of the capacitor is disconnected to the first power source line;
converting a first value on the node to a first digital data;
discharging the capacitor by connecting the node of the capacitor to a first power source line supplied with a second power source potential, after the node is disconnected from the input terminal;
connecting the node of the capacitor to the input terminal, after the node of the capacitor is disconnected from the second power source line;
converting a second value on the node to a second digital data;
comparing the first digital data with the second digital data to determine whether a difference exists between the first and second digital data; and
determining that the input terminal is abnormal when the difference exists.

* * * * *